United States Patent
Kim

(10) Patent No.: US 11,442,664 B2
(45) Date of Patent: Sep. 13, 2022

(54) MEMORY SYSTEM AND METHOD OF OPERATING THE SAME

(71) Applicant: SK hynix Inc., Gyeonggi-do (KR)

(72) Inventor: Kwang Su Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/069,938

(22) Filed: Oct. 14, 2020

(65) Prior Publication Data

US 2021/0026570 A1     Jan. 28, 2021

Related U.S. Application Data

(60) Division of application No. 16/601,128, filed on Oct. 14, 2019, now Pat. No. 10,838,662, which is a
(Continued)

(30) Foreign Application Priority Data

Jul. 18, 2017    (KR) .................. 10-2017-0090916

(51) Int. Cl.
| | |
|---|---|
| *G11C 16/32* | (2006.01) |
| *G06F 3/06* | (2006.01) |
| *G11C 16/06* | (2006.01) |
| *G11C 16/12* | (2006.01) |
| *G06F 13/00* | (2006.01) |
| *G11C 7/10* | (2006.01) |

(Continued)

(52) U.S. Cl.
CPC .......... *G06F 3/0659* (2013.01); *G06F 3/0611* (2013.01); *G06F 3/0679* (2013.01); *G06F 12/02* (2013.01); *G06F 13/00* (2013.01); *G11C 7/1015* (2013.01); *G11C 16/06* (2013.01); *G11C 16/12* (2013.01); *G11C 16/26* (2013.01); *G11C 16/32* (2013.01); *G11C 2207/2272* (2013.01)

(58) Field of Classification Search
CPC ...................................................... G06F 3/0659
See application file for complete search history.

(56) References Cited

U.S. PATENT DOCUMENTS

| | | | |
|---|---|---|---|
| 10,037,246 B1 * | 7/2018 | Laws ..................... | G06F 11/106 |
| 10,539,989 B1 * | 1/2020 | Pedersen ............... | G06F 1/3206 |

(Continued)

FOREIGN PATENT DOCUMENTS

CN       1648843 A     8/2005

OTHER PUBLICATIONS

English translation of Office Action issued by the Chinese Patent Office dated Dec. 3, 2021.

*Primary Examiner* — Douglas King
(74) *Attorney, Agent, or Firm* — IP & T Group LLP

(57) ABSTRACT

Provided herein may be a memory system and a method of operating the same. The method of operating a memory system may include receiving a first program command, and performing an operation corresponding to the first program command, receiving a second program command while performing the operation corresponding to the first program command, delaying setting of a queue status register for the second program command by a first wait time, receiving a third read command before the first wait time elapses, and setting the queue status register for the third read command before setting the queue status register for the second program command.

6 Claims, 12 Drawing Sheets

Related U.S. Application Data continuation of application No. 15/893,821, filed on Feb. 12, 2018, now Pat. No. 10,445,021.

(51) Int. Cl.
 *G11C 16/26* (2006.01)
 *G06F 12/02* (2006.01)

(56) References Cited

U.S. PATENT DOCUMENTS

| | | | |
|---|---|---|---|
| 10,998,056 B1* | 5/2021 | Shin | G11C 16/26 |
| 2008/0059672 A1* | 3/2008 | Irish | G06F 13/36 |
| | | | 710/116 |
| 2016/0342365 A1* | 11/2016 | Nosaka | G06F 3/0625 |
| 2018/0157415 A1* | 6/2018 | Choi | G06F 3/0659 |
| 2019/0384534 A1* | 12/2019 | Shin | G06F 3/061 |

* cited by examiner

MEMORY SYSTEM AND METHOD OF OPERATING THE SAME

CROSS-REFERENCE TO RELATED APPLICATION

The application is a division of U.S. patent application Ser. No. 16/601,128 filed on Oct. 14, 2019, which is a continuation of U.S. patent application Ser. No. 15/893,821 filed on Feb. 12, 2018 and issued as U.S. Pat. No. 10,445,021 on Oct. 15, 2019, which claims benefits of priority of Korean Patent Application No. 10-2017-0090916 filed on Jul. 18, 2017. The disclosure of each of the foregoing application is incorporated herein by reference in its entirety.

BACKGROUND

1. Field of Invention

Various embodiments of the present disclosure generally relate to a memory system. Particularly, the embodiments relate to a memory system with improved read latency by delaying setting of a queue status register (QSR) for a command, and an operating method of the same.

2. Description of Related Art

Semiconductor memory devices may be classified into a volatile semiconductor memory device and a nonvolatile semiconductor memory device. A volatile semiconductor memory device is advantageous in that reading and writing may be performed at high speeds, but is disadvantageous in that stored information is lost when the supply of power is interrupted. In contrast, a nonvolatile semiconductor memory device may retain information stored therein even if the supply of power is interrupted. Therefore, the nonvolatile semiconductor memory device is used to store information that needs to be retained regardless of whether power is supplied.

Examples of the nonvolatile semiconductor memory device may include a mask read-only memory (MROM), a programmable read-only memory (PROM), an erasable programmable read-only memory (EPROM), an electrically erasable programmable read-only memory (EEPROM), etc.

An example of the nonvolatile semiconductor memory device may include a flash memory device. A flash memory device has been widely used as an audio and video data storage medium for electronic devices such as a computer, a mobile phone, a personal digital assistant (PDA), a digital camera, a camcorder, a voice recorder, an MP3 player, a handheld personal computer (PC), a game console, a facsimile, a scanner, and a printer.

Recently, as a demand for high integration of memory devices has increased, multi-bit flash memory devices in which multiple bits are stored in a single memory cell have been popular.

A memory device may include a plurality of memory cells coupled to a single word line, and may perform a program operation which stores data in memory cells and an erase operation which erases programmed data.

SUMMARY

Various embodiments of the present disclosure are directed to a memory system with improved read latency and a method of operating the same.

An embodiment of the present disclosure may provide for a method of operating a memory system. The method may include receiving a first program command, and performing an operation corresponding to the first program command, receiving a second program command while performing the operation corresponding to the first program command, delaying setting of a queue status register for the second program command by a first wait time, receiving a third read command before the first wait time elapses, and setting the queue status register for the third read command before setting the queue status register for the second program command.

An embodiment of the present disclosure may provide for a method of operating a memory system. The method may include receiving a second program command while performing an operation corresponding to a first program command, delaying setting of a queue status register for the second program command until a first wait time elapses, receiving a third read command before the first wait time elapses, setting the queue status register for the third read command before setting the queue status register for the second program command, after the operation corresponding to the first program command is completed, starting an operation corresponding to the third read command based on a set status of the queue status register, and after the operation corresponding to the third read command has started, delaying setting of the queue status register for the second program command until a second wait time elapses.

An embodiment of the present disclosure may provide for a memory system. The memory system may include a memory device, and a memory controller, wherein the memory controller is configured to delay, when a first command is received from a host, setting of a queue status register for the first command by a predetermined wait time.

An embodiment of the present disclosure may provide for an operating method of a memory system including a memory device configured to perform operations according to an order of queued commands. The operating method may include holding queueing a program operation for a holding time when the program operation is provided while controlling the memory device to perform a current operation, and queueing a read operation prior to the program operation when the read operation is provided during the holding time.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

The drawings are not necessarily to scale and, in some instances, proportions may have been exaggerated in order to clearly illustrate features of the embodiments.

The terminology used herein is for the purpose of describing particular embodiments only and is not intended to be limiting of the present invention.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It will be understood that when an element is referred to as being "coupled" or "connected" to a certain element, it may be directly coupled or connected to the certain element or may be indirectly coupled or connected to the certain element, with intervening elements being present therebetween. In the specification, when an element is referred to as "comprising" or "including" a component, it does not exclude other components but may further include other components unless a description to the contrary is specifically pointed out in context.

Hereinafter, the various embodiments of the present invention will be described in detail with reference to the attached drawings.

Figure 1:
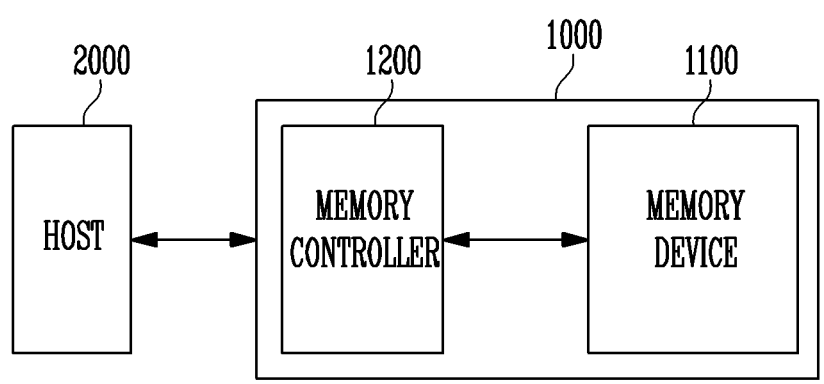
FIG. 1 is a diagram illustrating a memory system according to an embodiment of the present disclosure.

FIG. 1 is a diagram illustrating a memory system 1000 according to an embodiment of the present disclosure.

Referring to FIG. 1, the memory system 1000 may include a memory device 1100 for storing data and a memory controller 1200 for controlling the memory device 1100 under the control of a host 2000.

The host 2000 may communicate with the memory system 1000 using an interface protocol such as a peripheral component interconnect-express (PCI-E), an advanced technology attachment (ATA), a serial ATA (SATA), a parallel ATA (PATA) or a serial attached SCSI (SAS). In addition, the interface protocol provided for the purpose of data communication between the host 2000 and the memory system 1000 is not limited to the above examples and may be an interface protocol such as a Universal Serial Bus (USB), a Multi-Media Card (MMC), an Enhanced Small Disk Interface (ESDI), or Integrated Drive Electronics (IDE).

The memory controller 1200 may control overall operation of the memory system 1000 and may control data exchange between the host 2000 and the memory device 1100. For example, the memory controller 1200 may program or read data by controlling the memory device 1100 in response to a request from the host 2000. Further, the memory controller 1200 may store information of main memory blocks and sub-memory blocks included in the memory device 1100, and may select the memory device 1100 so that a program operation is performed on a main memory block or a sub-memory block depending on the amount of data that is loaded for the program operation. In an embodiment, examples of the memory device 1110 may include a double data rate synchronous dynamic random access memory (DDR SDRAM), a low power double data rate 4 (LPDDR4) SDRAM, a graphics double data rate SDRAM (GDDR SDRAM), a low power DDR (LPDDR) SDRAM, a Rambus dynamic random access memory (RDRAM), or a flash memory.

The memory device 1100 may perform a program operation, a read operation or an erase operation under the control of the memory controller 1200.

Figure 2:
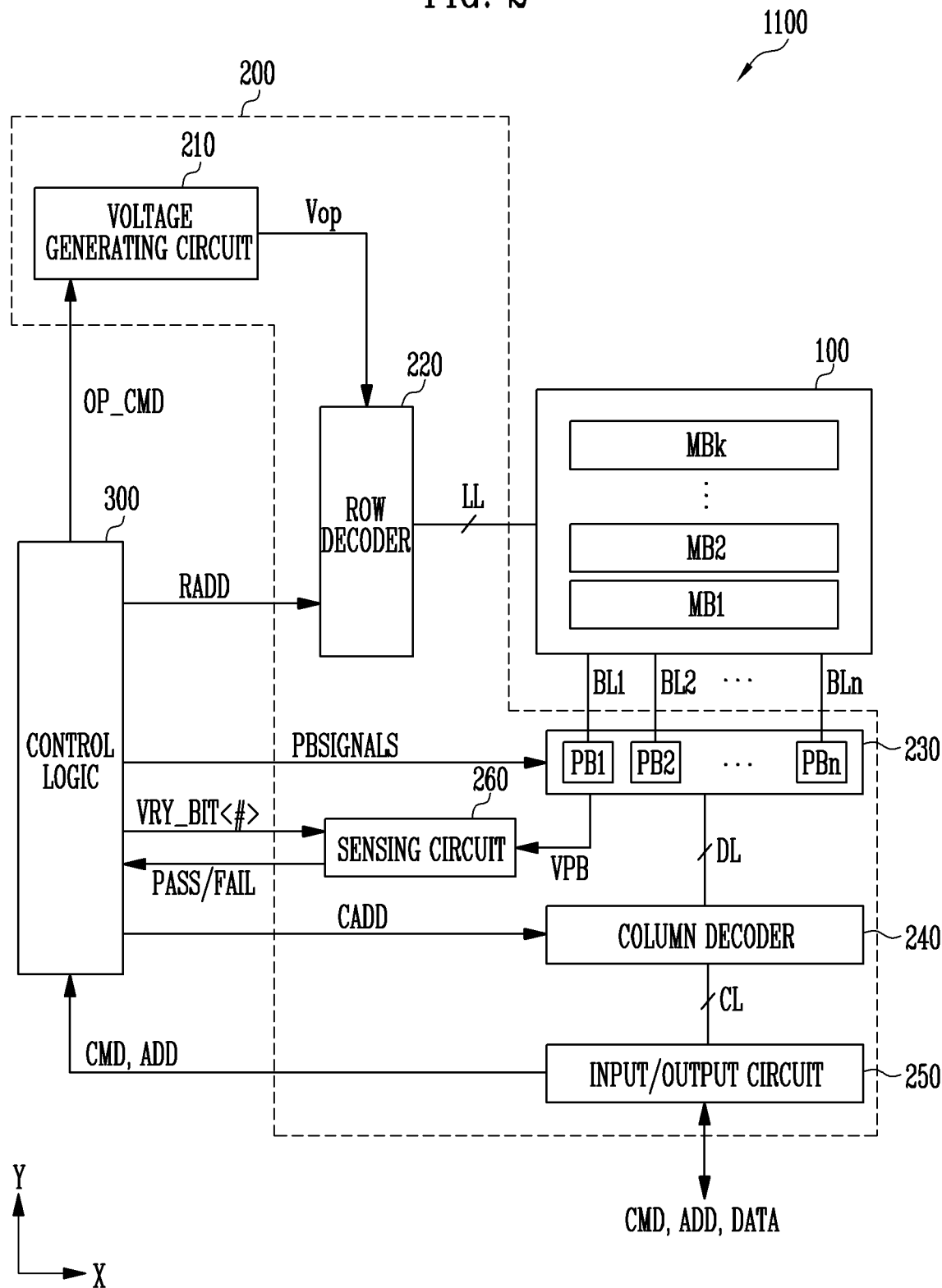
FIG. 2 is a diagram illustrating a memory device of FIG. 1.

FIG. 2 is a diagram illustrating the memory device 1100.

Referring to FIG. 2, the memory device 1100 may include a memory cell array 100 in which data is stored. The memory device 1100 may also include peripheral circuits 200, which perform a program operation for storing data in the memory cell array 100, a read operation for outputting stored data, and an erase operation for erasing stored data. The memory device 1100 may include a control logic 300, which controls the peripheral circuits 200 under the control of a memory controller (e.g., 1200 of FIG. 1).

The memory cell array 100 may include a plurality of memory blocks MB1 to MBk (where k is a positive integer). Local lines LL and bit lines BL1 to BLn (where n is a positive integer) may be coupled to each of the memory blocks MB1 to MBk. For example, the local lines LL may include a first select line, a second select line, and a plurality of word lines arranged between the first and second select lines. Further, the local lines LL may include dummy lines arranged between the first select line and the word lines and between the second select line and the word lines. Here, the first select line may be a source select line, and the second select line may be a drain select line. For example, the local lines LL may include word lines, drain and source select lines, and source lines SL. For example, the local lines LL may further include dummy lines. For example, the local lines LL may further include pipelines. The local lines LL may be coupled to the memory blocks MB1 to MBk 110, respectively, and the bit lines BL1 to BLn may be coupled in common to the memory blocks MB1 to MBk. The memory blocks MB1 to MBk may be implemented as a two-dimensional (2D) or a three-dimensional (3D) structure. For example, the memory cells in the memory blocks having a 2D structure may be arranged horizontally on a substrate.

For example, memory cells in the memory blocks having a 3D structure may be stacked vertically on the substrate.

The peripheral circuits 200 may perform a program, read, or erase operation on a selected memory block among the memory blocks under the control of the control logic 300. For example, the peripheral circuits 200 may supply a verify voltage and pass voltages to the first select line, the second select line, and the word lines, may selectively discharge the first select line, the second select line, and the word lines, and may verify memory cells coupled to a word line selected from among the word lines, under the control of the control logic 300. For example, the peripheral circuits 200 may include a voltage generating circuit 210, a row decoder 220, a page buffer group 230, a column decoder 240, an input/output circuit 250, and a sensing circuit 260.

The voltage generating circuit 210 may generate various operating voltages Vop used for program, read and erase operations in response to an operation signal OP_CMD. Further, the voltage generating circuit 210 may selectively discharge the local lines LL in response to the operation signal OP_CMD. For example, the voltage generating circuit 210 may generate a program voltage, a verify voltage, pass voltages, a turn-on voltage, a read voltage, an erase voltage, a source line voltage, etc. under the control of the control logic 300.

The row decoder 220 may transfer the operating voltages Vop to the local lines LL coupled to a selected memory block among the memory blocks in response to a row address RADD.

The page buffer group 230 may include a plurality of page buffers PB1 to PBn coupled to the bit lines BL1 to BLn. The page buffers PB1 to PBn may be operated in response to page buffer control signals PBSIGNALS. For example, the page buffers PB1 to PBn may temporarily store data received through the bit lines BL1 to BLn or may sense the voltages or currents of the bit lines BL1 to BLn during a read or a verify operation.

The column decoder 240 may transfer data between the input/output circuit 250 and the page buffer group 230 in response to a column address CADD. For example, the column decoder 240 may exchange data with the page buffers through data lines DL or may exchange data with the input/output circuit 250 through column lines CL.

The input/output circuit 250 may transfer a command CMD and an address ADD received from the memory controller (not illustrated) to the control logic 300, or may exchange data DATA with the column decoder 240.

The sensing circuit 260 may generate a reference current in response to an enable bit VRY_BIT<#> and may output a pass signal PASS or a fail signal FAIL by comparing a sensing voltage VPB, received from the page buffer group 230, with a reference voltage, generated based on the reference current, during the read operation or the verify operation.

The control logic 300 may control the peripheral circuits 200 by outputting the operation signal OP_CMD, the row address RADD, the page buffer control signals PBSIGNALS, and the enable bit VRY_BIT<#> in response to the command CMD and the address ADD. Further, the control logic 300 may determine whether a verify operation has passed or failed in response to the pass or fail signal PASS or FAIL.

Figure 3:
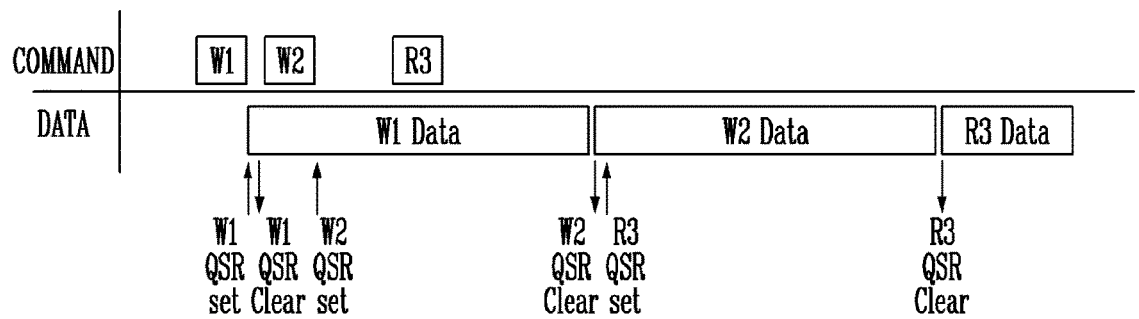
FIG. 3 is a diagram illustrating a method of operating a memory system according to an embodiment of the present disclosure.

FIG. 3 is a diagram illustrating a method of operating the memory system 1000.

Referring to FIG. 3, in response to a first program command W1 from the host 2000, the memory controller 1200 may set a queue status register (QSR) for the first program command W1 and may control the memory device 1100 to perform a program operation corresponding to the first program command W1 using program data W1 Data. Since the QSR for the first program command W1 is set, a value of the QSR for the first program command W1 may be '0'. Since the QSR for the first program command W1 is set, a program operation in response to the first program command W1 may be performed subsequent to completion of an operation currently being performed.

The memory controller 1200 may control the operation of the memory device 1100 based on the set status of the QSR. In other words, when the QSR is set for the first program command W1 and the memory device 1100 is in an idle state, the memory controller 1200 may control the memory device 1100 so that a program operation corresponding to the first program command W1 is immediately performed based on the set status of the QSR. Further, when the QSR is set for the first program command W1 and the memory device 1100 is currently performing another operation, the memory controller 1200 may control the memory device 1100 so that the program operation corresponding to the first program command W1 is performed based on the set status of the QSR after the current operation is completed.

After the memory device 1100 starts to perform the program operation corresponding to the first program command W1, the memory controller 1200 may clear the QSR for the first program command. After the QSR is cleared, the memory controller 1200 may set the QSR for another operation.

While the memory device 1100 performs a program operation corresponding to the first program command W1, the memory controller 1200 may receive a second program command W2 from the host 2000. In response to the second program command W2, the memory controller 1200 may set the QSR for the second program command W2.

While the memory device 1100 performs a program operation corresponding to the first program command W1, the memory controller 1200 may receive a third read command R3 from the host 2000. In this case, since the current QSR is set for the second program command W2, setting of the QSR for the third read command R3 may be delayed.

After the memory device 1100 completes the program operation corresponding to the first program command W1, the memory controller 1200 may perform a subsequent operation based on the set status of the QSR. In an example of FIG. 3, since the QSR is currently set for the second program command W2, the memory controller 1200 may control the memory device 1100 so that the memory device 1100 performs a program operation corresponding to the second program command W2.

After the memory device 1100 starts to perform the program operation corresponding to the second program command W2, the memory controller 1200 may clear the QSR for the second program command W2. As described above, the memory controller 1200 may set the QSR for another operation when the QSR is cleared. As in the example of FIG. 3, when the QSR is delayed to be set for the third read command R3, the memory controller 1200 may set the QSR for the third read command R3.

After the memory device 1100 completes the program operation corresponding to the second program command W2, the memory controller 1200 may perform a subsequent operation based on the set status of the QSR. In an example of FIG. 3, since the QSR is currently set in response to the third read command R3, the memory controller 1200 may control the memory device 1100 so that the memory device 1100 performs a read operation corresponding to the third read command R3, and may receive third read data R3 Data from the memory device 1100.

As described above, the QSR may indicate an operation to be subsequently performed after the memory device 1100 completes the operation currently being performed thereby. In an embodiment, when the program operation corresponding to the first program command W1 is currently being performed, and the QSR is set for the second program command W2, the memory controller 1200 may control the memory device 1100 so that the memory device 1100 performs a program operation corresponding to the second program command W2 based on the set status of the QSR after completion of the program operation corresponding to the first program command W1.

Further, after the memory controller 1200 controls the memory device 1100 to start the program operation corresponding to the second program command W2 based on the set status of the QSR, the memory controller 1200 may clear the QSR for the second program command W2 in order to set the QSR for a subsequent operation. In other words, the memory controller 1200 may set the QSR for a new operation when the QSR is cleared.

When a new command is inputted from the host 2000 while the QSR is set, the memory controller 1200 may delay setting of the QSR for the new command until the QSR is cleared.

Figure 4:
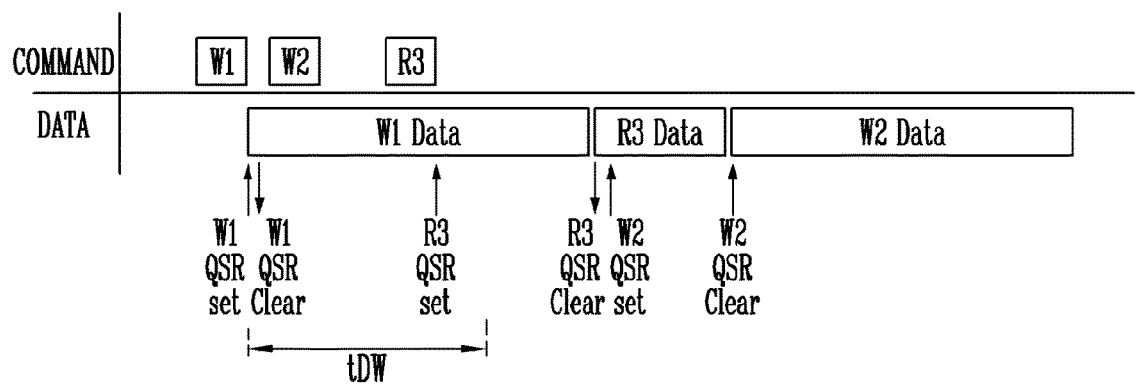
FIG. 4 is a diagram illustrating a method of operating a memory system according to an embodiment of the present disclosure.

FIG. 4 is a diagram illustrating a method of operating the memory system 1000.

Referring to FIG. 4, the memory controller 1200 may receive a first program command W1 from the host 2000. The memory controller 1200 may set the QSR for the first program command W1 in response to the first program command W1, and may control the memory device 1100 so that a program operation corresponding to the first program command W1 is performed using program data W1 Data.

After the memory device 1100 starts to perform the program operation corresponding to the first program command W1, the memory controller 1200 may clear the QSR for the first program command W1.

While the memory device 1100 performs a program operation corresponding to the first program command W1, the memory controller 1200 may receive a second program command W2 from the host 2000. In this case, unlike the example described with reference to FIG. 3, the memory controller 1200 may delay setting of the QSR for the second program command W2 by a predetermined write wait time tDW. In other words, the memory controller 1200 may wait without setting the QSR for the second program command W2 until the write wait time tDW elapses.

The write wait time tDW may be a certain time interval from a time point at which the QSR is cleared. The write wait time tDW may be a certain time interval from the time point at which the QSR is cleared to a time point at which a program operation currently being performed is completed. Duration of the write wait time tDW may depend on the program operation currently being performed.

The memory controller 1200 may receive a third read command R3 from the host 2000 while delaying the setting of the QSR for the second program command W2 without performing the setting during the write wait time tDW. The memory controller 1200 may set the QSR for the third read command R3 in response to the third read command R3 before setting the QSR for the second program command W2.

In accordance with an embodiment of the present invention, when a read command is inputted while the setting of the QSR for a program command is delayed until the wait time tDW elapses, the setting of the QSR for the read command may be first performed and the setting of the QSR for the program command may be further delayed.

After the memory device 1100 completes the program operation corresponding to the first program command W1, the memory controller 1200 may perform a subsequent operation based on the set status of the QSR. In an example of FIG. 4, since the current QSR is set for the third read command R3, the memory controller 1200 may control the memory device 1100 so that the memory device 1100 performs a read operation corresponding to the third read command R3.

After the memory device 1100 starts to perform the read operation corresponding to the third read command R3, the memory controller 1200 may clear the QSR for the third read command R3. As described above, the memory controller 1200 may set the QSR for an additional operation after the QSR is cleared. As in the example of FIG. 4, when the QSR is delayed to be set for the second program command W2, the memory controller 1200 may set the QSR for the second program command W2. In this case, the setting of the QSR for the second program command W2 may be immediately performed without a separate wait time.

After the memory device 1100 completes the read operation corresponding to the third read command R3, the memory controller 1200 may perform a subsequent operation based on the set status of the QSR. In an example of FIG. 4, since the current QSR is set in response to the second program command W2, the memory controller 1200 may control the memory device 1100 so that the memory device 1100 performs a program operation corresponding to the second program command W2, and may transmit second program data W2 Data to the memory device 1100.

In accordance with an embodiment of the present invention, when setting of the QSR for an earlier program command is delayed by a predetermined wait time and a later read command is inputted before the wait time elapses, the QSR may be set for the later read command prior to the earlier program command in order to serve the later read command prior to the earlier program command. Therefore, the read operation in response to the later read command may be immediately performed after the operation currently being performed is completed, thereby reducing latency in a read operation. Generally, a read operation consumes operation time shorter than that of a program operation, and the memory system 1000 needs to output read data within a short period of time in response to the read command from the host 2000. Therefore, as described above, the setting of the QSR for the program command is delayed by a predetermined wait time. When a read command is inputted before the wait time elapses, setting of the QSR for the read command is first performed. Then, the read operation for the subsequently inputted read command is performed prior to the program operation for the previously inputted program command, thereby reducing read latency. Read latency may mean the elapsed time from the input of the read command until read data is outputted.

Figure 5:
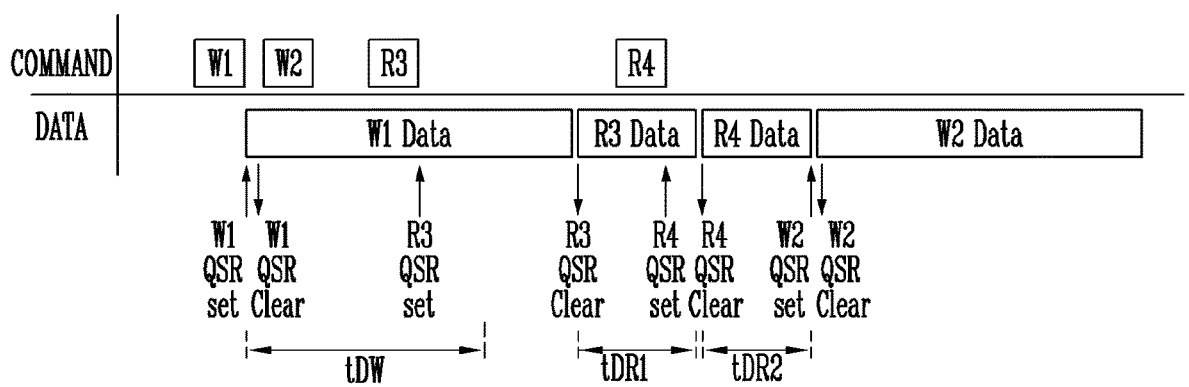
FIG. 5 is a diagram illustrating a method of operating a memory system according to an embodiment of the present disclosure.

FIG. 5 is a diagram illustrating a method of operating the memory system 1000.

Referring to FIG. 5, the memory controller 1200 may receive a first program command W1 from the host 2000. The memory controller 1200 may set a QSR for the first program command W1 in response to the first program command W1, and may control the memory device 1100 so that a program operation corresponding to the first program command W1 is performed using program data W1 Data. Further, after the memory device 1100 starts to perform the program operation corresponding to the first program command W1, the memory controller 1200 may clear the QSR for the first program command W1.

While the memory device 1100 performs a program operation corresponding to the first program command W1, the memory controller 1200 may receive a second program command W2 from the host 2000. In this case, unlike the example described with reference to FIG. 3, the memory controller 1200 may delay setting of the QSR for the second program command W2 by a predetermined write wait time tDW. In other words, the memory controller 1200 may wait without setting the QSR for the second program command W2 during the write wait time tDW.

The write wait time tDW may be a certain time interval from a time point at which the QSR is cleared. The write wait time tDW may be a certain time interval from the time point at which the QSR is cleared to a time point at which a program operation currently being performed is completed. Duration of the write wait time tDW may depend on the program operation currently being performed.

The memory controller 1200 may receive a third read command R3 from the host 2000 while delaying the setting of the QSR for the second program command W2 without performing the setting during the write wait time tDW. The memory controller 1200 may set the QSR for the third read command R3 in response to the third read command R3 before setting the QSR for the second program command W2.

In accordance with an embodiment of the present invention, when a read command is inputted while the setting of the QSR for a program command is delayed until the write wait time tDW elapses, the memory controller 1200 may first set the QSR for the read command, and may further delay the setting of the QSR for the second program command.

After the memory device 1100 completes the program operation corresponding to the first program command W1, the memory controller 1200 may perform a subsequent operation based on the set status of the QSR. In an example of FIG. 5, since the current QSR is set for the third read command R3, the memory controller 1200 may control the memory device 1100 so that the memory device 1100 performs a read operation corresponding to the third read command R3.

After the memory device 1100 starts to perform the read operation corresponding to the third read command, the memory controller 1200 may clear the QSR for the third read command R3. In this case, unlike the example described above with reference to FIG. 4, the memory controller 1200 may clear the QSR for the third read command R3, and may then delay the setting of the QSR for the second program command W2 by a first read wait time tDR1. In other words, the memory controller 1200 may wait without setting the QSR for the second program command W2 during the first read wait time tDR1.

The first read wait time tDR1 may be a certain time interval from a time point at which the QSR is cleared. The first read wait time tDR1 may be a certain time interval from the time point at which the QSR is cleared to a time point at which the read operation currently being performed is completed. Duration of the first read wait time tDR1 may depend on the read operation currently being performed. The wait time, that is, a write wait time or a read wait time, may be determined differently according to the operation that is currently being performed.

The first read wait time tDR1 may be set to a time different from the write wait time tDW. The first read wait time tDR1 may be shorter than the write wait time tDW.

The wait time required to set the QSR for the program command may be variable according to the operation that is currently being performed. In other words, wait times required to set the QSR for the program command may be different from each other in a case where the operation currently being performed is a program operation and in a case where the operation currently being performed is a read operation.

After the memory device 1100 starts to perform the read operation corresponding to the third read command R3, and the memory controller 1200 clears the QSR for the third read command R3, setting of the QSR for the second program command W2 may be delayed by the first read wait time tDR1. While the setting of the QSR for the second program command W2 is delayed, the memory controller 1200 may receive a fourth read command R4 from the host 2000. In other words, before the first read wait time tDR1 elapses, the memory controller 1200 may receive the fourth read command R4 from the host 2000. In this case, the memory controller 1200 may set the QSR for the fourth read command R4 in response to the fourth read command R4. That is, the operation of setting the QSR for the second program command W2 has priority lower than that of the operation of setting the QSR for the fourth read command R4.

After the memory device 1100 completes the read operation corresponding to the third read command R3, the memory controller 1200 may perform a subsequent operation based on the set status of the QSR. In an example of FIG. 5, since the current QSR is set in response to the fourth read command R4, the memory controller 1200 may control the memory device 1100 so that the memory device 1100 performs a read operation corresponding to the fourth read command R4.

After the memory device 1100 starts to perform a read operation corresponding to the fourth read command R4 and the memory controller 1200 clears the QSR for the fourth read command R4, setting of the QSR for the second program command W2 may be delayed by a second read wait time tDR2. In an embodiment, as illustrated in FIG. 5, when an additional read command is not received during the second read wait time tDR2, the memory controller 1200 may set the QSR for the second program command W2 after the second read wait time tDR2 has elapsed. The second read wait time tDR2 may have duration identical to or different from the first read wait time tDR1.

After the memory device 1100 completes the read operation corresponding to the fourth read command R4, the memory controller 1200 may perform a subsequent operation based on the set status of the QSR. In an example of FIG. 5, since the current QSR is set in response to the second program command W2, the memory controller 1200 may control the memory device 1100 so that the memory device 1100 performs a program operation corresponding to the second program command W2.

Figure 6:
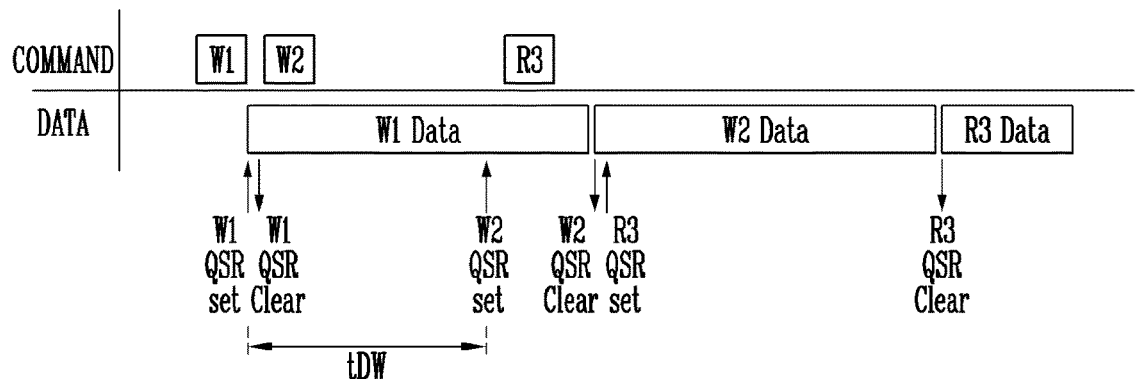
FIG. 6 is a diagram illustrating a method of operating a memory system according to an embodiment of the present disclosure.

FIG. 6 is a diagram illustrating a method of operating the memory system 1000.

Referring to FIG. 6, the memory controller 1200 may receive a first program command W1 from the host 2000. The memory controller 1200 may set a QSR for the first program command W1 in response to the first program command W1, and may control the memory device 1100 so that a program operation corresponding to the first program command W1 is performed using program data W1 Data. After the memory device 1100 starts to perform the program operation corresponding to the first program command W1, the memory controller 1200 may clear the QSR for the first program command W1.

While the memory device 1100 performs a program operation corresponding to the first program command W1, the memory controller 1200 may receive a second program command W2 from the host 2000. In this case, unlike the example described with reference to FIG. 3, the memory controller 1200 may delay setting of the QSR for the second program command W2 by a predetermined write wait time tDW. In other words, the memory controller 1200 may wait without setting the QSR for the second program command W2 until the write wait time tDW elapses.

The memory controller 1200 may not receive a read command from the host 2000 while delayed without setting the QSR for the second program command W2 during the write wait time tDW. In this case, the memory controller 1200 may set the QSR for the second program command W2 after the write wait time tDW has elapsed.

The memory controller 1200 may receive a third read command R3 from the host 2000 after setting the QSR for the second program command. The setting of the QSR for the third read command R3 may be delayed without being performed until the QSR for the second program command W2 is cleared.

After the memory device 1100 completes the program operation corresponding to the first program command W1, the memory controller 1200 may perform a subsequent operation based on the set status of the QSR. In an example of FIG. 6, since the current QSR is set for the second program command W2, the memory controller 1200 may control the memory device 1100 so that the memory device 1100 performs a program operation corresponding to the second program command W2.

After the memory device 1100 starts to perform the program operation corresponding to the second program command W2, the memory controller 1200 may clear the QSR for the second program command W2. Thereafter, the memory controller 1200 may set the QSR for the third read command R3 that is delayed.

After the memory device 1100 completes the program operation corresponding to the second program command W2, the memory controller 1200 may perform a subsequent operation based on the set status of the QSR. In an example of FIG. 6, since the QSR is currently set for the third read command R3, the memory controller 1200 may control the memory device 1100 so that the memory device 1100 performs a read operation corresponding to the third read command R3.

Figure 7:
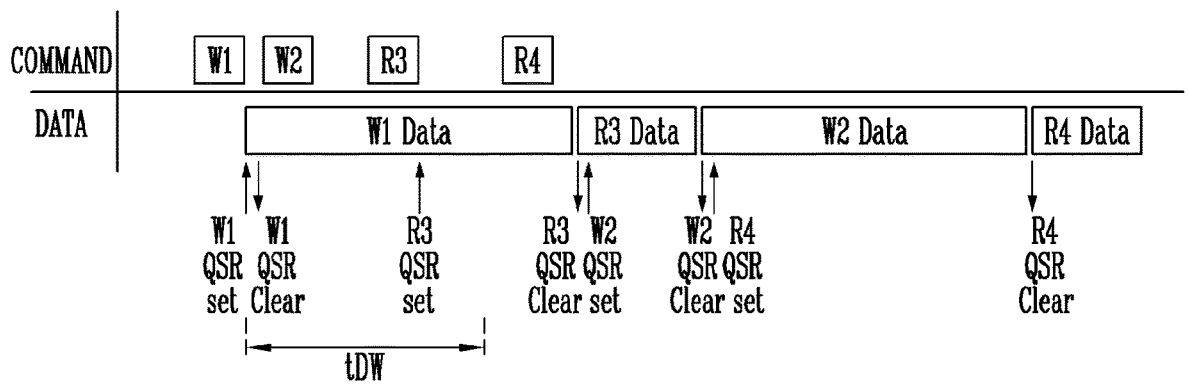
FIG. 7 is a diagram illustrating a method of operating a memory system according to an embodiment of the present disclosure.

FIG. 7 is a diagram illustrating a method of operating the memory system 1000.

Referring to FIG. 7, the memory controller 1200 may receive a first program command W1 from the host 2000. The memory controller 1200 may set a QSR for the first program command W1 in response to the first program command W1, and may control the memory device 1100 so that a program operation corresponding to the first program command W1 is performed using program data W1 Data. After the memory device starts to perform the program operation corresponding to the first program command W1, the memory controller 1200 may clear the QSR for the first program command W1.

While the memory device 1100 performs a program operation corresponding to the first program command W1, the memory controller 1200 may receive a second program command W2 from the host 2000. In this case, unlike the example described with reference to FIG. 3, the memory controller 1200 may delay setting of the QSR for the second program command W2 by a predetermined write wait time tDW. In other words, the memory controller 1200 may wait without setting the QSR for the second program command W2 until the write wait time tDW elapses.

The write wait time tDW may be a certain time interval from a time point at which the QSR is cleared. The write wait time tDW may be a certain time interval from the time point at which the QSR is cleared to a time point at which a program operation currently being performed is completed. Duration of the write wait time tDW may depend on the program operation currently being performed.

The memory controller 1200 may receive a third read command R3 from the host 2000 while delaying the setting of the QSR for the second program command W2 during the write wait time tDW. The memory controller 1200 may set the QSR for the third read command R3 in response to the third read command R3 before setting the QSR for the second program command W2.

In accordance with an embodiment of the present invention, when a read command is inputted while the setting of the QSR for a program command is delayed until the wait time tDW elapses, the setting of the QSR for the read command may be first performed, and the setting of the QSR for the program command may be further delayed.

Before the memory device 1100 completes a program operation corresponding to the first program command W1, the memory controller 1200 may receive a fourth read command R4 from the host 2000. Since the QSR is currently set for the third read command R3, the setting of the QSR for the fourth read command R4 may be delayed.

After the memory device 1100 completes the program operation corresponding to the first program command W1, the memory controller 1200 may perform a subsequent operation based on the set status of the QSR. In an example of FIG. 7, since the current QSR is set for the third read command R3, the memory controller 1200 may control the memory device 1100 so that the memory device 1100 performs a read operation corresponding to the third read command R3.

After the memory device 1100 starts to perform the read operation corresponding to the third read command R3, the memory controller 1200 may clear the QSR for the third read command R3. Thereafter, the memory controller 1200 may immediately set the QSR for the second program command W2 that is delayed. Priority may be assigned to the second program command W2 that has been inputted first between the second program command W2 and the fourth read command R4 that are delayed.

As exemplified above, in accordance with an embodiment of the present invention, a delay of the setting of the QSR depending on priorities between commands may be limitedly applied only to commands that are inputted during a wait time. A delay of the setting of the QSR depending on priorities between commands may be limitedly applied only to a single command.

After the memory device 1100 completes the read operation corresponding to the third read command R3, the memory controller 1200 may perform a subsequent operation based on the set status of the QSR. In an example of FIG. 7, since the QSR is currently set for the second program command W2, the memory controller 1200 may control the memory device 1100 so that the memory device 1100 performs a program operation corresponding to the second program command W2.

After the memory device 1100 starts to perform the program operation corresponding to the second program command W2, and the memory controller 1200 clears the QSR for the second program command W2, the memory controller 1200 may set the QSR for the fourth read command R4 that is delayed. Thereafter, after the memory device 1100 completes the program operation corresponding to the second program command W2, the memory controller 1200 may perform a read operation corresponding to the fourth read command R4 based on the set status of the QSR.

Figure 8:
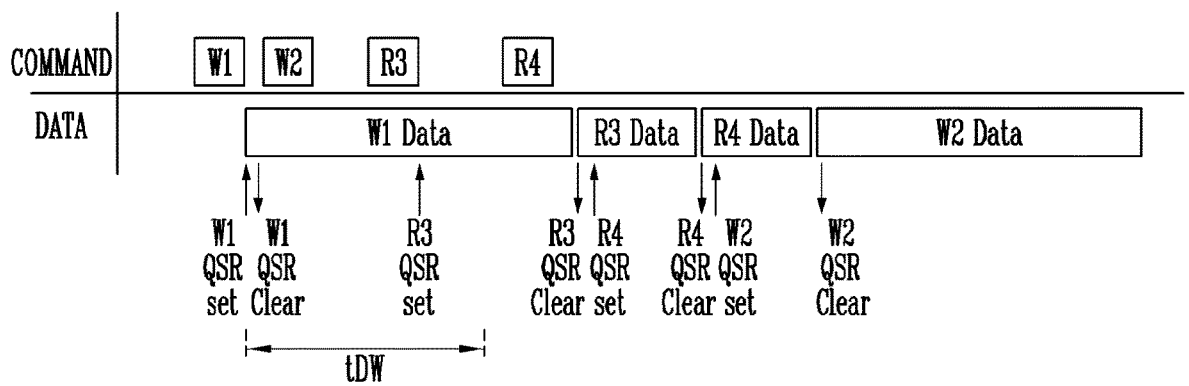
FIG. 8 is a diagram illustrating a method of operating a memory system according to an embodiment of the present disclosure.

FIG. 8 is a diagram illustrating a method of operating the memory system 1000.

Referring to FIG. 8, the memory controller 1200 may receive a first program command W1 from the host 2000. The memory controller 1200 may set a QSR for the first program command W1 in response to the first program command W1, and may control the memory device 1100 so that a program operation corresponding to the first program command W1 is performed using program data W1 Data. After the memory device starts to perform the program operation corresponding to the first program command W1, the memory controller 1200 may clear the QSR for the first program command W1.

While the memory device 1100 performs a program operation corresponding to the first program command W1, the memory controller 1200 may receive a second program command W2 from the host 2000. In this case, unlike the example described with reference to FIG. 3, the memory controller 1200 may delay setting of the QSR for the second program command W2 by a predetermined write wait time tDW. In other words, the memory controller 1200 may wait without setting the QSR for the second program command W2 during the write wait time tDW.

The write wait time tDW may be a certain time interval from a time point at which the QSR is cleared. The write wait time tDW may be a certain time interval from a time point at which the QSR is cleared to a time point at which a program operation currently being performed is completed. Duration of the write wait time tDW may depend on the program operation currently being performed.

The memory controller 1200 may receive a third read command R3 from the host 2000 while delaying the setting the QSR for the second program command W2 during the write wait time tDW. The memory controller 1200 may set the QSR for the third read command R3 in response to the third read command R3 before setting the QSR for the second program command W2.

In accordance with an embodiment of the present invention, when a read command is inputted while the setting of the QSR for a program command is delayed until the wait time tDW elapses, the setting of the QSR for the read command may be first performed, and the setting of the QSR for the program command may be further delayed.

Before the memory device 1100 completes a program operation corresponding to the first program command W1, the memory controller 1200 may receive a fourth read command R4 from the host 2000. Since the current QSR is set for the third read command R3, setting of the QSR for the fourth read command R4 may be delayed.

After the memory device 1100 completes the program operation corresponding to the first program command W1, the memory controller 1200 may perform a subsequent operation based on the set status of the QSR. In an example of FIG. 8, since the current QSR is set for the third read command R3, the memory controller 1200 may control the memory device 1100 so that the memory device 1100 performs a read operation corresponding to the third read command R3.

After the memory device 1100 starts to perform the read operation corresponding to the third read command R3, the memory controller 1200 may clear the QSR for the third read command R3. Thereafter, the memory controller 1200 may immediately set the QSR for the fourth read command R4 that is delayed.

In accordance with an embodiment of the present invention, the QSR may be set by assigning higher priority to a read command than to a program command, rather than assigning higher priority to a program command that has been inputted first between a program command and a read command that are delayed. The memory controller 1200 may set the QSR for a command corresponding to an operation having higher priority, among a plurality of commands that have been inputted before clearing the QSR. In other words, the memory controller 1200 may assign higher priority to a read command when a program command and a read command have been inputted and are delayed before clearing the QSR, and may assign higher priority to a command that has been inputted first, among commands corresponding to the same operation.

After the memory device 1100 completes the read operation corresponding to the third read command R3, the memory controller 1200 may perform a subsequent operation based on the set status of the QSR. In an example of FIG. 8, since the QSR is currently set for the fourth read command R4, the memory controller 1200 may control the memory device 1100 so that the memory device 1100 performs a read operation corresponding to the fourth read command R4.

After the memory device 1100 starts to perform the read operation corresponding to the fourth read command R4, and the memory controller 1200 clears the QSR for the fourth read command R4, the memory controller 1200 may set the QSR for the second program command W2 that is delayed. Thereafter, after the memory device 1100 completes the read operation corresponding to the fourth read command R4, the memory controller 1200 may perform a program operation corresponding to the second program command W2 based on the set status of the QSR.

Figure 9:
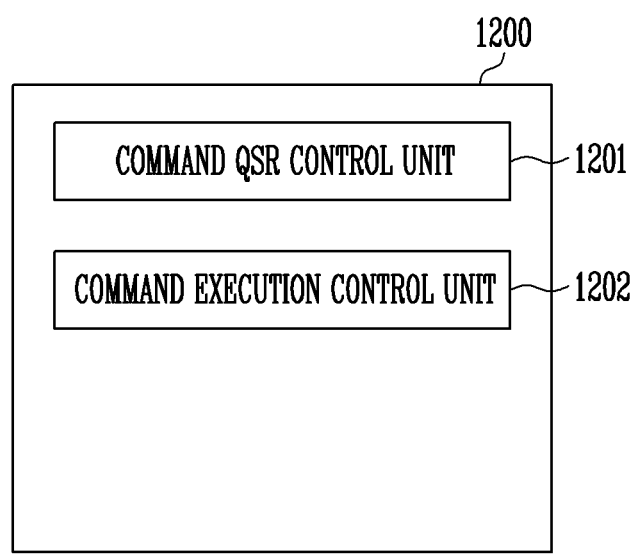
FIG. 9 is a diagram illustrating a memory controller according to an embodiment of the present disclosure.

FIG. 9 is a diagram illustrating the memory controller 1200.

Referring to FIG. 9, the memory controller 1200 may include a command QSR control unit 1201 and a command execution control unit 1202.

The command QSR control unit 1201 may control setting of the QSR for an inputted command. In an embodiment, when a new program command is inputted while a current program operation is being performed, the command QSR control unit may delay setting of the QSR for the new program command by a write wait time tDW. Further, when a read command is inputted before the write wait time tDW elapses, the command QSR control unit 1201 may first set the QSR for the read command rather than setting the QSR for the program command that has been inputted first. When a read command is not inputted or another program command is inputted before the write wait time tDW elapses, the command QSR control unit 1201 may set first the QSR for the program command that has been inputted first after the write wait time tDW has elapsed.

When a new program command is inputted during the performance of the current read operation or when there is a program command that has been previously inputted and is delayed, the command QSR control unit 120 may delay the setting of the QSR for the new program command or for the program command that has been previously inputted and is delayed by a read wait time tDR. Furthermore, when a new read command is inputted before the read wait time tDR elapses, the command QSR control unit 1201 may first set the QSR for the newly inputted read command rather than setting the QSR for the program command that has been inputted first. When a read command is not inputted or another program command is inputted before the read wait time tDR elapses, the command QSR control unit 1201 may set the QSR for the program command that has been inputted first after the read wait time tDR has elapsed.

In other words, the command QSR control unit 1201 may delay the setting of the QSR for each inputted command by a predetermined time and an operation of assigning priorities to a plurality of inputted commands.

The command execution control unit 1202 may control the operation of the memory device 1100 under the control of the command QSR control unit 1201. In other words, the command execution control unit 1202 may control the operation of the memory device 1100 based on the set status of the QSR by the command QSR control unit 1201.

Further, the command QSR control unit 1201 may allow the memory device 1100 to perform an operation corresponding to the set status of the current QSR, and then to perform a QSR clear operation.

Figure 10:
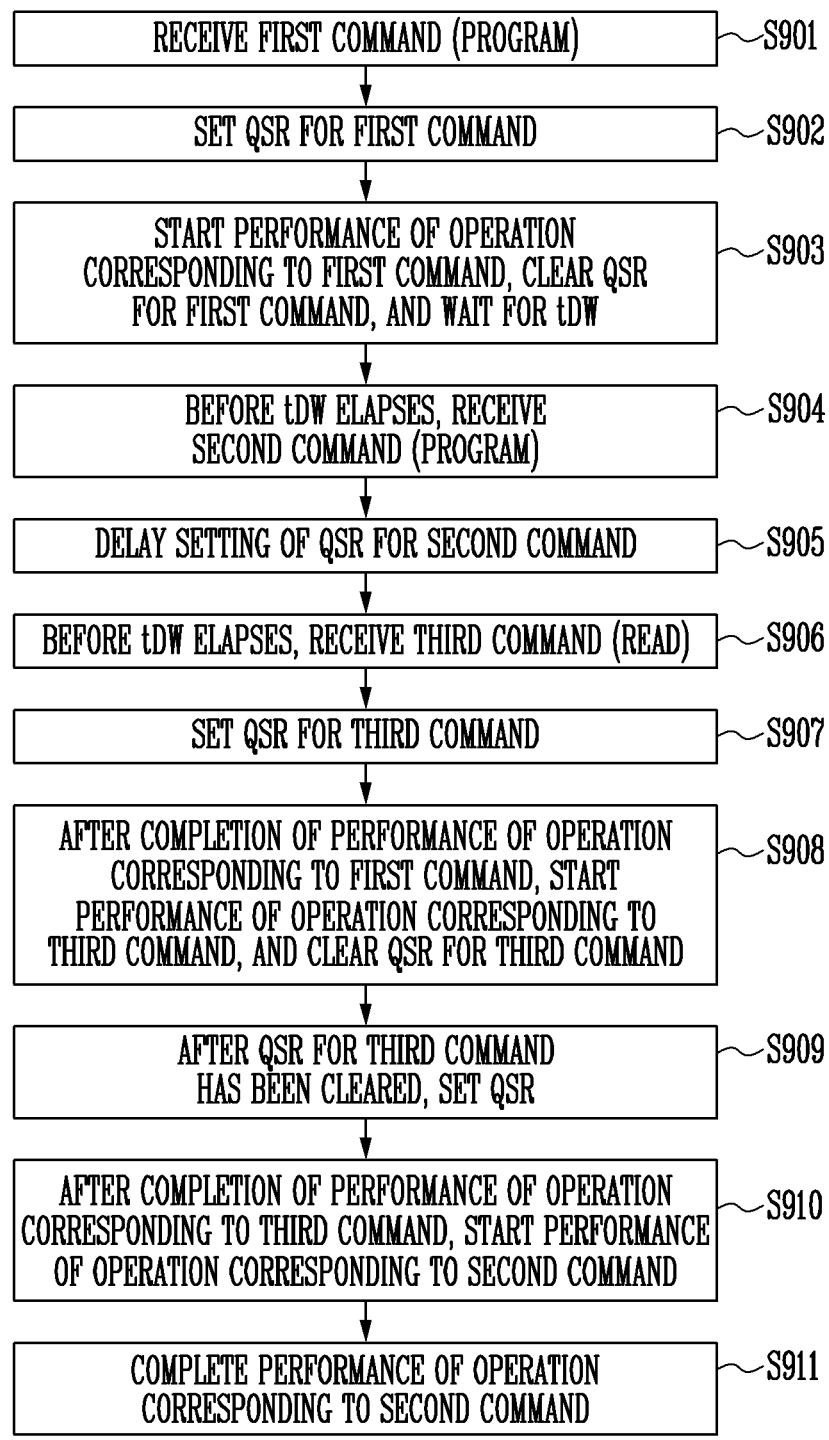
FIG. 10 is a flowchart illustrating a method of operating a memory system according to an embodiment of the present disclosure.

FIG. 10 is a flowchart illustrating a method of operating the memory system 1000.

Referring to FIG. 10, the memory controller 1200 may receive a first program command from the host 2000 at step S901. The memory controller 1200 may set the QSR for the first program command in response to the first program command at step S902. The memory controller 1200 may control the memory device 1100 so that the memory device 1100 performs a program operation corresponding to the first program command based on the setting of the QSR, may clear the QSR for the first program command, and may then wait for a write wait time tDW at step S903.

Before the write wait time tDW elapses, a second program command may be received from the host 2000 at step S904. Here, the memory controller 1200 may delay setting of the QSR for the second program command until the write wait time tDW elapses at step S905. Here, before the write wait time tDW elapses after the second program command has been received, a third read command may be received from the host 2000 at step S906. The memory controller 1200 may set the QSR for the third command in response to the third read command before setting the QSR for the second program command at step S907.

After the program operation corresponding to the first program command is completed, the memory controller 1200 may control the memory device 1100 so that the memory device 1100 performs a read operation corresponding to the third read command based on the set status of the QSR, and may clear the QSR at step S908. After the QSR for the third command is cleared, the memory controller 1200 may set the QSR for the second program command at step S909.

After the memory device 1100 completes the read operation corresponding to the third read command, the memory controller 1200 may control the memory device 1100 so that the memory device 1100 performs a program operation corresponding to the second program command based on the set status of the QSR at step S910. Thereafter, the program operation corresponding to the second program command may be completed at step S911.

Figure 11:
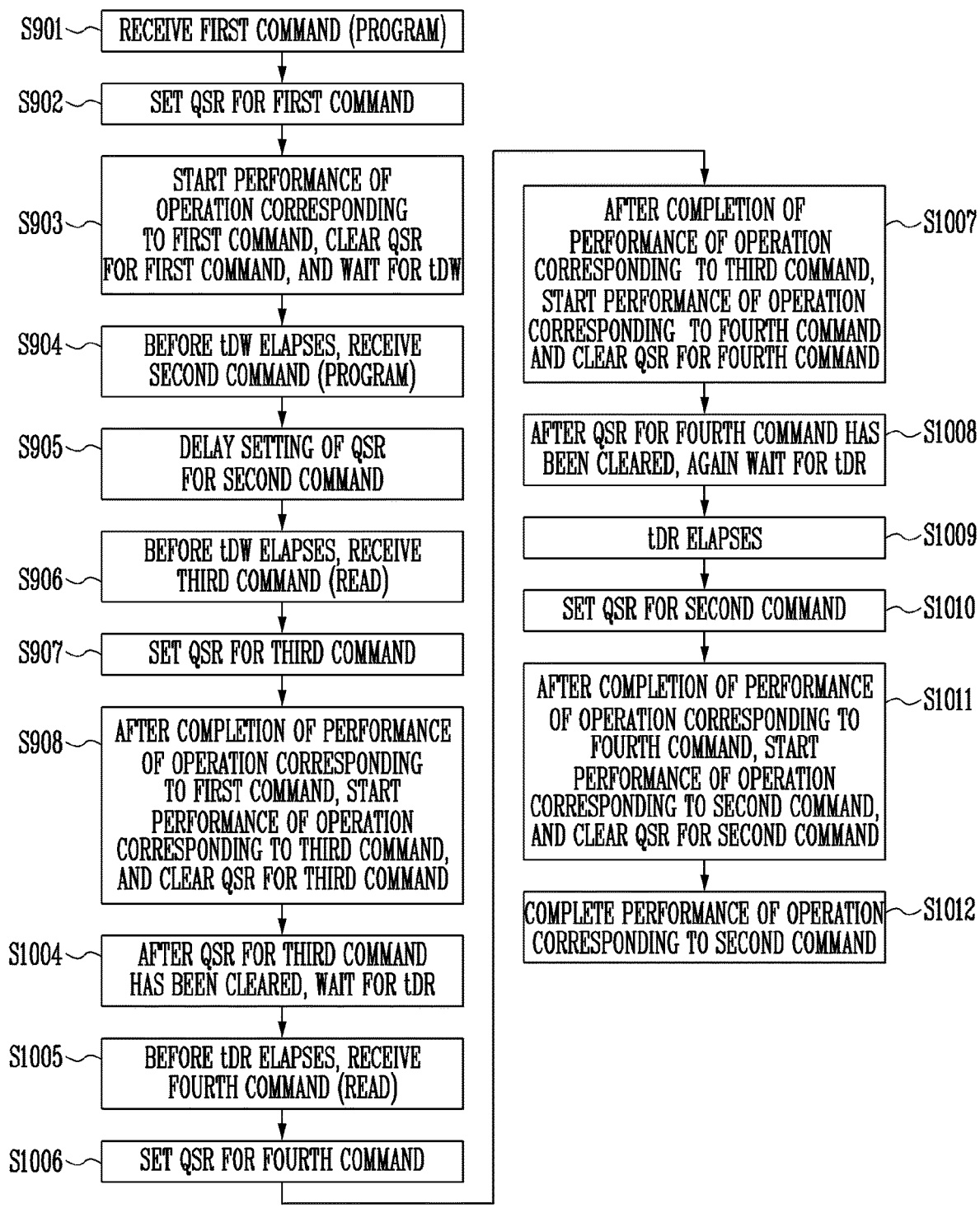
FIG. 11 is a flowchart illustrating a method of operating a memory system according to an embodiment of the present disclosure.

FIG. 11 is a flowchart illustrating a method of operating the memory system 1000.

Referring to FIG. 11, the memory controller 1200 may receive a first program command from the host 2000 at step S901. The memory controller 1200 may set the QSR for the first program command in response to the first program command at step S902. The memory controller 1200 may control the memory device 1100 so that the memory device 1100 performs a program operation corresponding to the first program command based on the setting of the QSR, may clear the QSR for the first program command, and may then wait for a write wait time tDW at step S903.

Before the write wait time tDW elapses, a second program command may be received from the host 2000 at step S904. Here, the memory controller 1200 may delay setting of the QSR for the second program command by the write wait time tDW at step S905. Here, before the write wait time tDW elapses after the second program command has been received, a third read command may be received from the host 2000 at step S906. The memory controller 1200 may set the QSR for the third read command in response to the third read command before setting the QSR for the second program command at step S907.

After the program operation corresponding to the first program command is completed, the memory controller 1200 may control the memory device 1100 so that the memory device 1100 performs a read operation corresponding to the third read command based on the set status of the QSR, and may clear the QSR at step S908. After clearing the QSR for the third read command, the memory controller 1200 may wait for the read wait time tDR without setting the QSR for the previously inputted second program command at step S1004. Here, before the read wait time tDR elapses, a fourth read command may be received from the host 2000 at step S1005. In this case, the memory controller 1200 may set the QSR for the fourth read command prior to setting the QSR for the second program command at step S1006.

After the read operation corresponding to the third read command is completed, the memory controller 1200 may control the memory device 1100 so that the memory device 1100 performs a read operation corresponding to the fourth read command based on the set status of the QSR, and may clear the QSR for the fourth read command at step S1007. The memory controller 1200 may wait again for the read wait time tDR without immediately setting the QSR for the second program command after clearing the QSR for the fourth read command at step S1008. If a new read command is not inputted until the read wait time tDR elapses at step S1009, the memory controller 1200 may set the QSR for the second program command at step S1010.

After the read operation corresponding to the fourth read command is completed, the memory controller 1200 may control the memory device 1100 so that the memory device 1100 performs a program operation corresponding to the second program command based on the set status of the QSR, and may clear the QSR for the second program command at step S1011. Thereafter, the memory device 1100 may complete the program operation corresponding to the second program command at step S1012.

Figure 12:
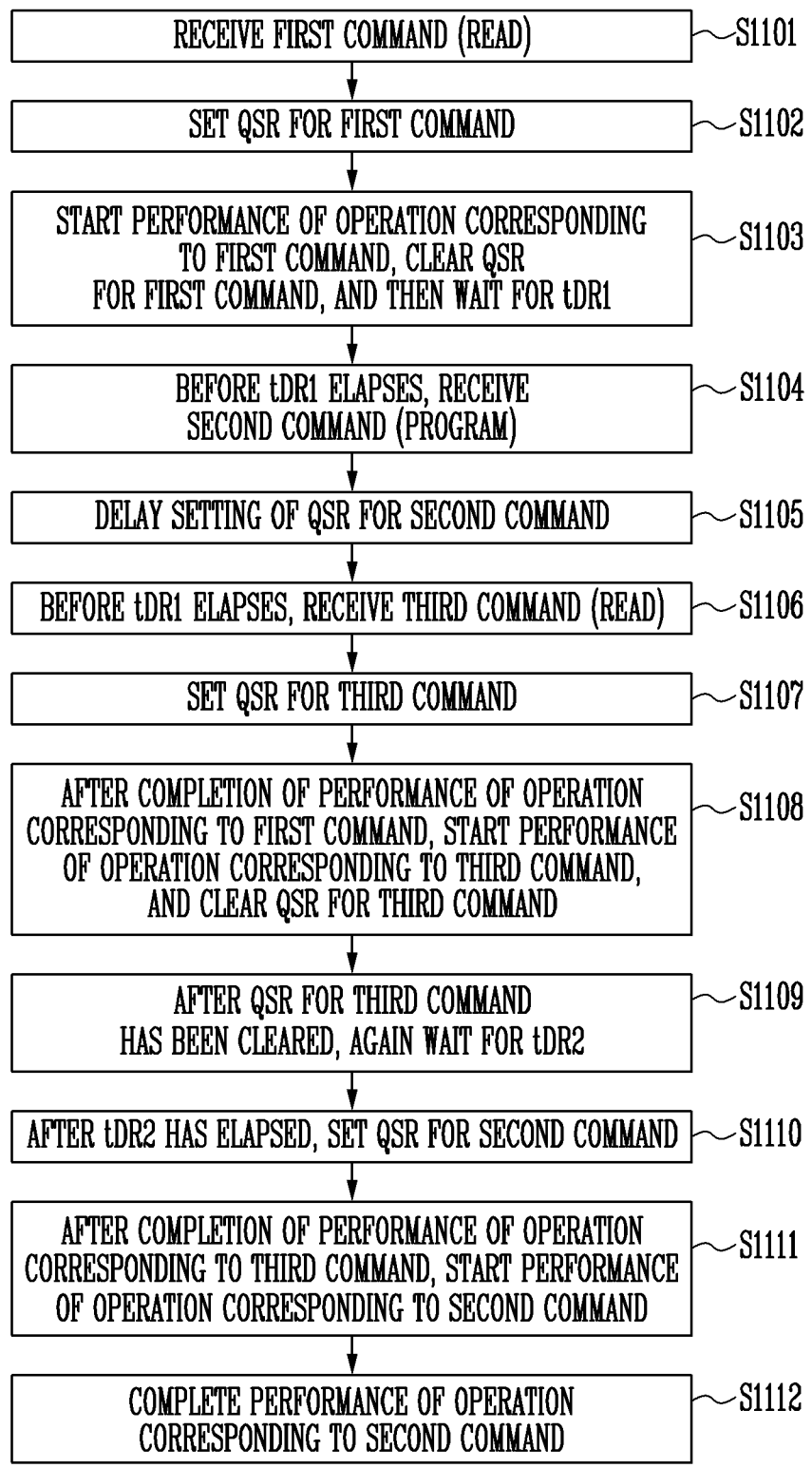
FIG. 12 is a flowchart illustrating a method of operating a memory system according to an embodiment of the present disclosure.

FIG. 12 is a flowchart illustrating a method of operating the memory system 1000.

Referring to FIG. 12, the memory controller 1200 may receive a first read command from the host 2000 at step S1101. The memory controller 1200 may set the QSR for the first read command in response to the first read command at step S1102. The memory controller 1200 may control the memory device 1100 so that the memory device 1100 performs a read operation corresponding to the first read command in response to the set status of the QSR, may clear the QSR for the first read command, and may then wait for a first read wait time tDR1 at step S1103.

Before the first read wait time tDR1 elapses, a second program command may be received from the host 2000 at step S1104. Here, the memory controller 1200 may delay setting of the QSR for the second program command until the first read wait time tDR1 elapses at step S1105. Here, before the first read wait time tDR1 elapses, a third read command may be received from the host 2000 at step S1106. The memory controller 1200 may set the QSR for the third read command in response to the third read command before setting the QSR for the second program command at step S1107.

After the read corresponding to the first read command is completed, the memory controller 1200 may control the memory device 1100 so that the memory device 1100 performs a read operation corresponding to the third read command based on the set status of the QSR, and may clear the QSR at step S1108. The memory controller 1200 may wait for a second read wait time tDR2 without setting the QSR for the second program command after clearing the QSR for the third read command at step S1109. Thereafter, if a new read command is not inputted until the second read wait time tDR2 elapses, the QSR for the second program command may be set after the second read wait time tDR2 has elapsed at step S1110.

After the memory device 1100 completes the read operation corresponding to the third read command, the memory controller 1200 may control the memory device 1100 so that the memory device 1100 performs a program operation corresponding to the second program command based on the set status of the QSR at step S1111. Thereafter, the program operation corresponding to the second program command may be completed at step S1112.

Figure 13:
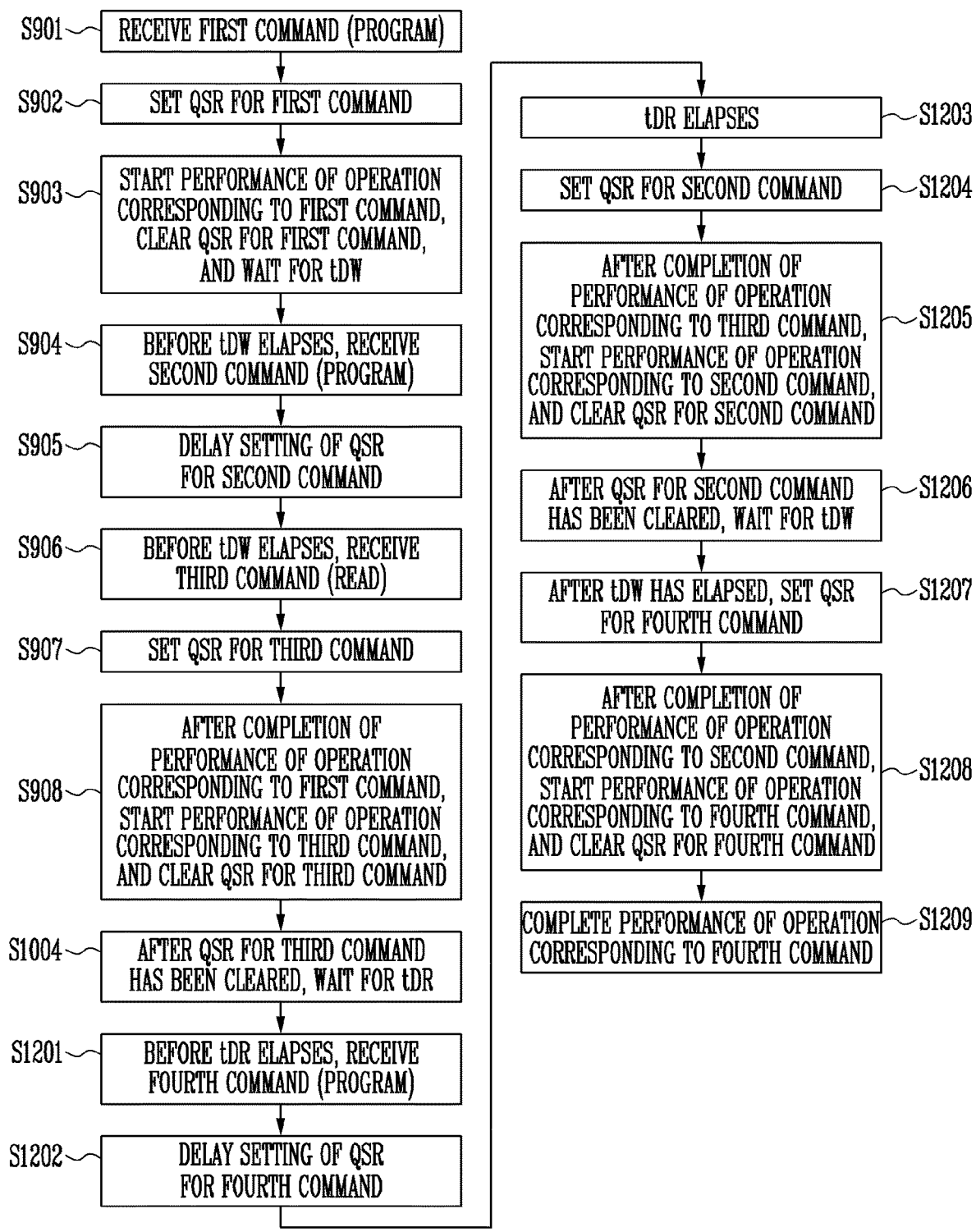
FIG. 13 is a flowchart illustrating a method of operating a memory system according to an embodiment of the present disclosure.

FIG. 13 is a flowchart illustrating a method of operating the memory system 1000.

Referring to FIG. 13, the memory controller 1200 may receive a first program command from the host 2000 at step S901. The memory controller 1200 may set the QSR for the first program command in response to the first program command at step S902. The memory controller 1200 may control the memory device 1100 so that the memory device 1100 performs a program operation corresponding to the first program command based on the setting of the QSR, may clear the QSR for the first program command, and may then wait for a write wait time tDW at step S903.

Before the write wait time tDW elapses, a second program command may be received from the host 2000 at step S904. Here, the memory controller 1200 may delay setting of the QSR for the second program command until the write wait time tDW elapses at step S905. Here, before the write wait time tDW elapses after the second program command has been received, a third read command may be received from the host 2000 at step S906. The memory controller 1200 may set the QSR for the third read command in response to the third read command before setting the QSR for the second program command at step S907.

After the program operation corresponding to the first program command is completed, the memory controller 1200 may control the memory device 1100 so that the memory device 1100 performs a read operation corresponding to the third read command based on the set status of the QSR, and may clear the QSR at step S908. After clearing the QSR for the third read command, the memory controller 1200 may wait for the read wait time tDR without setting the QSR for the previously inputted second program command at step S1004. Here, before the read wait time tDR elapses, the memory controller 1200 may receive a fourth program command from the host 2000 at step S1201. The memory controller 1200 may wait without the setting of the QSR for the previously inputted second program command and the setting of the QSR for the fourth program command until the read wait time tDR elapses at step S1202. After the read wait time tDR has elapsed at step S1203, the memory controller 1200 may set the QSR for the second program command that has been inputted earlier than the fourth program command at step S1204.

After the read operation corresponding to the third read command is completed, the memory controller 1200 may control the memory device 1100 so that the memory device 1100 performs a program operation corresponding to the second program command, and may clear the QSR for the second program command at step S1205. After clearing the QSR for the second program command, the memory controller 1200 may wait without setting the QSR for the fourth program command during the write wait time tDW at step S1206. Here, if a new read command is not inputted until the write wait time tDW elapses, the QSR for the fourth program command may be set after the write wait time tDW has elapsed at step S1207.

Finally, after the program operation corresponding to the second program command is completed, the memory controller 1200 may control the memory device 1100 so that the memory device 1100 performs a program operation corresponding to the fourth program command, and may clear the QSR for the fourth program command at step S1208. Thereafter, the memory device 1100 may complete the program operation corresponding to the fourth program command at step S1209.

Figure 14:
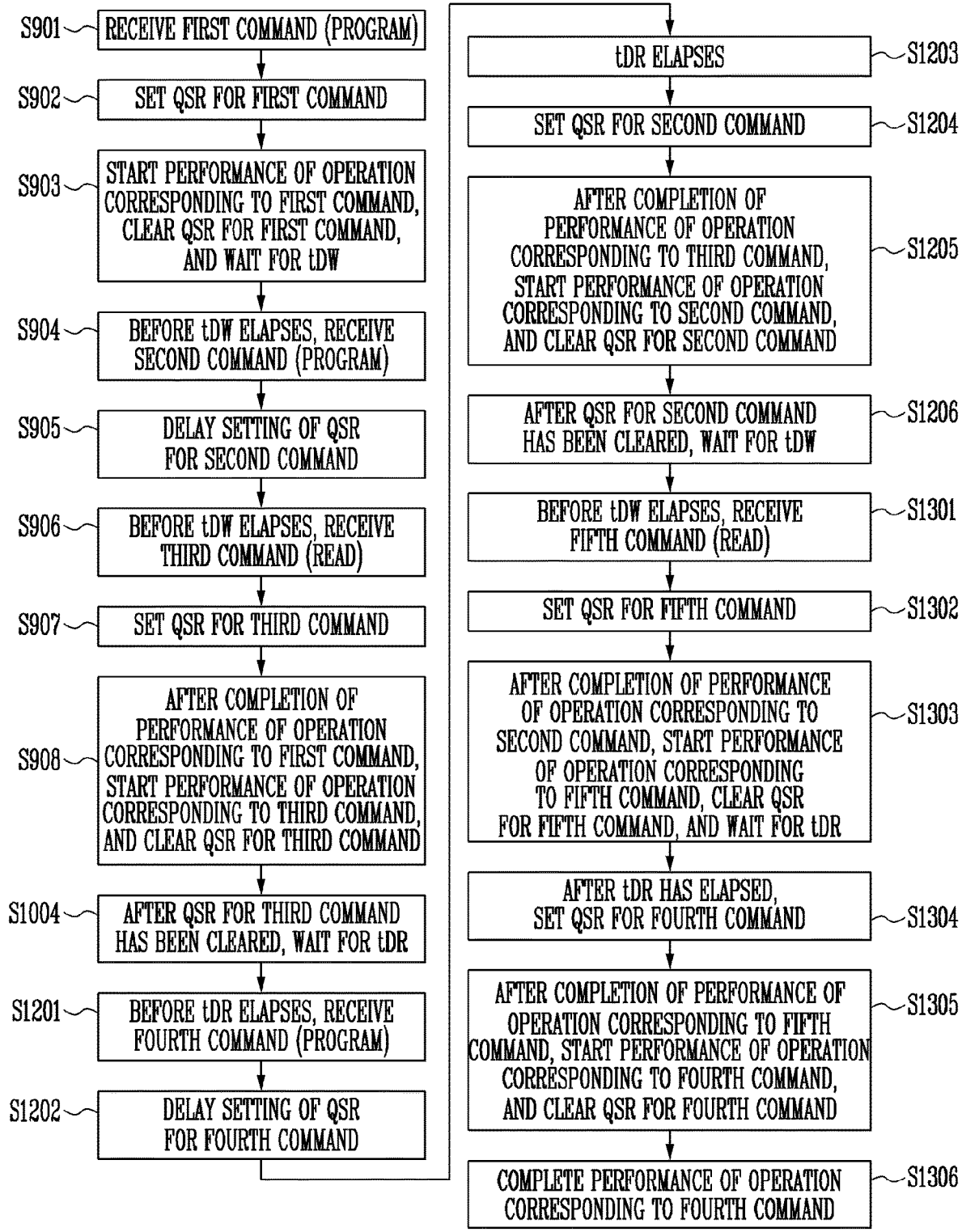
FIG. 14 is a flowchart illustrating a method of operating a memory system according to an embodiment of the present disclosure.

FIG. 14 is a flowchart illustrating a method of operating the memory system 1000.

Referring to FIG. 14, the memory controller 1200 may receive a first program command from the host 2000 at step S901. The memory controller 1200 may set the QSR for the first program command in response to the first program command at step S902. The memory controller 1200 may control the memory device 1100 so that the memory device 1100 performs a program operation corresponding to the first program command based on the setting of the QSR, may clear the QSR for the first program command, and may then wait for a write wait time tDW at step S903.

Before the write wait time tDW elapses, a second program command may be received from the host 2000 at step S904. Here, the memory controller 1200 may delay setting of the QSR for the second program command until the write wait time tDW elapses at step S905. Here, before the write wait time tDW elapses after the second program command has been received, a third read command may be received from the host 2000 at step S906. The memory controller 1200 may set the QSR for the third read command in response to the third read command before setting the QSR for the second program command at step S907.

After the program operation corresponding to the first program command is completed, the memory controller 1200 may control the memory device 1100 so that the memory device 1100 performs a read operation corresponding to the third read command based on the set status of the QSR, and may clear the QSR at step S908. After clearing the QSR for the third read command, the memory controller 1200 may wait for the read wait time tDR without setting the QSR for the previously inputted second program command at step S1004. Here, before the read wait time tDR elapses, the memory controller 1200 may receive a fourth program command from the host 2000 at step S1201. The memory controller 1200 may wait without the setting of the QSR for the previously inputted second program command and the setting of the QSR for the fourth program command until the read wait time tDR elapses at step S1202. After the read wait time tDR has elapsed at step S1203, the memory controller 1200 may set the QSR for the second program command that has been inputted earlier than the fourth program command at step S1204.

After the read operation corresponding to the third read command is completed, the memory controller 1200 may control the memory device 1100 so that the memory device 1100 performs a program operation corresponding to the second program command, and may clear the QSR for the second program command at step S1205. After clearing the QSR for the second program command, the memory controller 1200 may wait without setting the QSR for the fourth program command during the write wait time tDW at step S1206. In this case, before the write wait time tDW elapses, the memory controller 1200 may receive a fifth read command from the host 2000 at step S1301. In this case, the memory controller 1200 may set the QSR for the fifth read command at step S1302.

After the program operation corresponding to the second program command is completed, the memory controller 1200 may control the memory device 1100 so that the memory device 1100 performs a read operation corresponding to the fifth read command, may clear the QSR for the fifth read command, and may then wait for the read wait time tDR before setting the QSR for the fourth program command at step S1303. If a new read command is not received before the read wait time tDR elapses, the memory controller 1200 may set the QSR for the fourth program command after the read wait time tDR has elapsed at step S1304.

Finally, after the read operation corresponding to the fifth read command is completed, the memory controller 1200 may control the memory device 1100 so that the memory device 1100 performs a program operation corresponding to the fourth program command, and may clear the QSR for the fourth program command at step S1305. Finally, the program operation corresponding to the fourth program command may be completed at step S1306.

Figure 15:
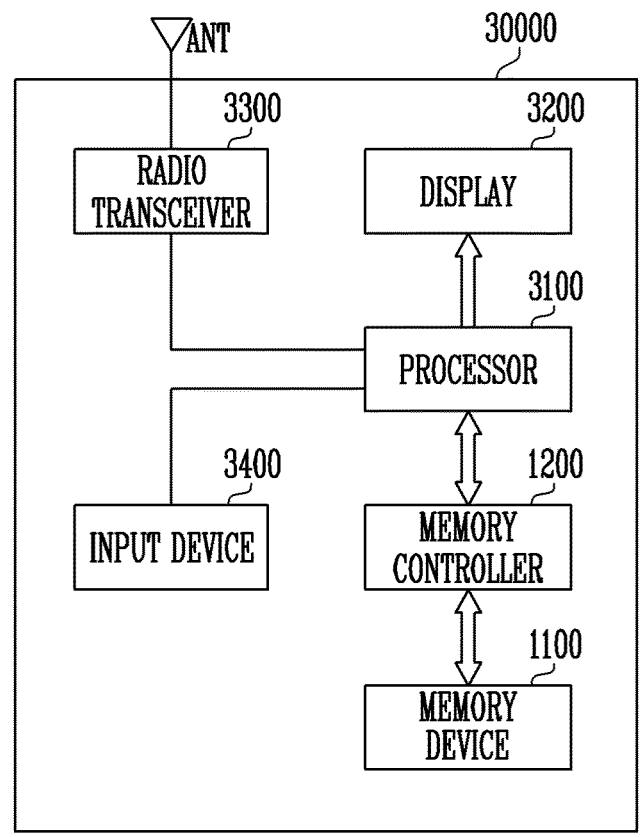
FIGS. 15 to 18 are diagrams illustrating application examples of a memory system including the memory controller illustrated in FIG. 9.

FIG. 15 is a diagram illustrating an application example of a memory system including the memory controller illustrated in FIG. 9.

Referring to FIG. 15, a memory system 30000 may be included in a cellular phone, a smartphone, a tablet PC, a personal digital assistant (PDA), or a wireless communication device. The memory system 30000 may include the memory device 1100 and a memory controller 1200 capable of controlling the operation of the memory device 1100. The memory controller 1200 may control a data access operation, e.g., a program, erase, or read operation, of the memory device 1100 under the control of a processor 3100.

Data programmed in the memory device 1100 may be output through a display 3200 under the control of the memory controller 1200.

A radio transceiver 3300 may send and receive radio signals through an antenna ANT. For example, the radio transceiver 3300 may change a radio signal received through the antenna ANT into a signal which may be processed by the processor 3100. Therefore, the processor 3100 may process a signal output from the radio transceiver 3300 and transmit the processed signal to the memory controller 1200 or the display 3200. The memory controller 1200 may program a signal processed by the processor 3100 to the memory device 1100. Furthermore, the radio transceiver 3300 may change a signal output from the processor 3100 into a radio signal, and output the changed radio signal to the external device through the antenna ANT. An input device 3400 may be used to input a control signal for controlling the operation of the processor 3100 or data to be processed by the processor 3100. The input device 3400 may be implemented as a pointing device such as a touch pad or a computer mouse, a keypad or a keyboard. The processor 3100 may control the operation of the display 3200 such that data output from the memory controller 1200, data output from the radio transceiver 3300, or data output from the input device 3400 is output through the display 3200.

In an embodiment, the memory controller 1200 capable of controlling the operation of the memory device 1100 may be implemented as a part of the processor 3100 or a chip provided separately from the processor 3100.

Figure 16:
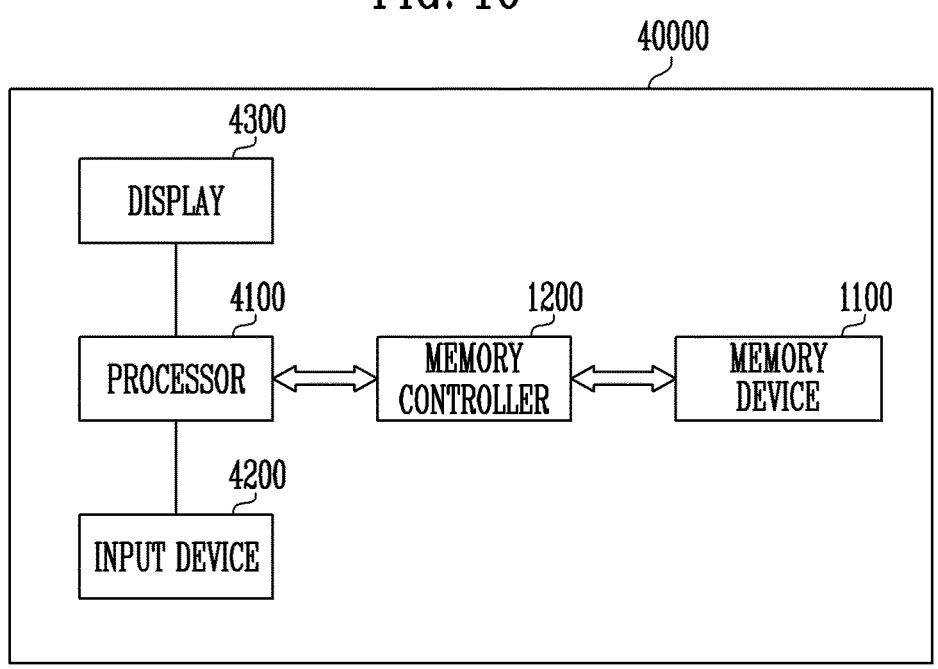

FIG. 16 is a diagram illustrating an application example of the memory system including the memory controller illustrated in FIG. 9.

Referring to FIG. 16, a memory system 40000 may be included in a personal computer, a tablet PC, a net-book, an e-reader, a personal digital assistant (PDA), a portable multimedia player (PMP), an MP3 player, or an MP4 player.

The memory system 40000 may include the memory device 1100 and a memory controller 1200 capable of controlling the data processing operation of the memory device 1100.

A processor 4100 may output data stored in the memory device 1100 through a display 4300, according to data input from an input device 4200. For example, the input device 4200 may be implemented as a point device such as a touch pad or a computer mouse, a keypad or a keyboard.

The processor 4100 may control the overall operation of the memory system 40000 and control the operation of the memory controller 1200. In an embodiment, the memory controller 1200 capable of controlling the operation of the memory device 1100 may be implemented as a part of the processor 4100 or a chip provided separately from the processor 4100.

Figure 17:
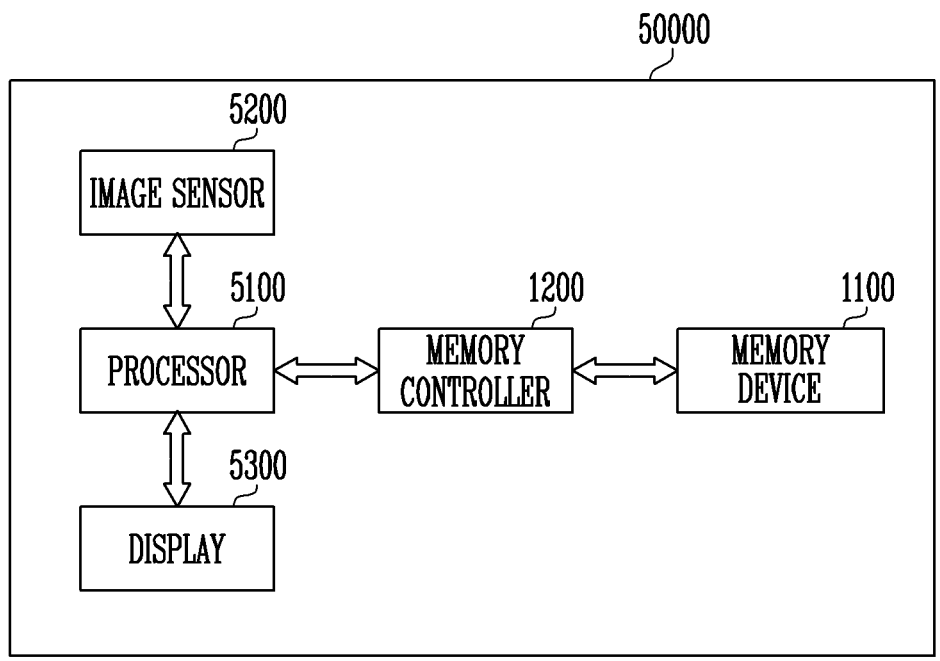

FIG. 17 is a diagram illustrating an application example of the memory system including the memory controller illustrated in FIG. 9.

Referring to FIG. 17, a memory system 50000 may be included in an image processing device, e.g., a digital camera, a portable phone provided with a digital camera, a smartphone provided with a digital camera, or a tablet PC provided with a digital camera.

The memory system 50000 may include the memory device 1100 and a memory controller 1200 capable of controlling a data processing operation, e.g., a program, erase, or read operation, of the memory device 1100.

An image sensor 5200 of the memory system 50000 may convert an optical image into digital signals. The converted digital signals may be transmitted to a processor 5100 or the memory controller 1200. Under the control of the processor 5100, the converted digital signals may be output through a display 5300 or stored in the memory device 1100 through the memory controller 1200. Data stored in the memory device 1100 may be output through the display 5300 under the control of the processor 5100 or the memory controller 1200.

In an embodiment, the memory controller 1200 capable of controlling the operation of the memory device 1100 may be implemented as a part of the processor 5100, or a chip provided separately from the processor 5100.

Figure 18:
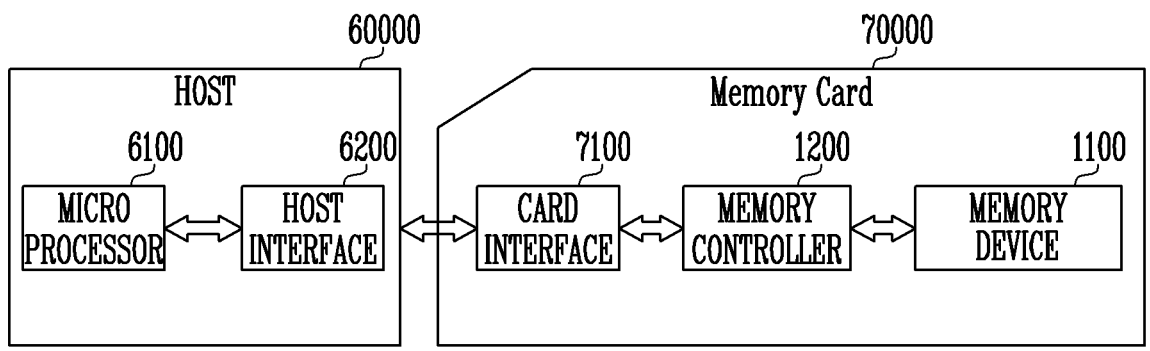

FIG. 18 is a diagram illustrating an application example of the memory system including the memory controller illustrated in FIG. 9.

Referring to FIG. 18, a memory system 70000 may be included in a memory card or a smart card. The memory system 70000 may include the memory device 1100, a memory controller 1200 and a card interface 7100.

The memory controller 1200 may control data exchange between the memory device 1100 and the card interface 7100. In an embodiment, the card interface 7100 may be a secure digital (SD) card interface or a multi-media card (MMC) interface, but it is not limited thereto.

The card interface 7100 may interface data exchange between a host 60000 and the memory controller 1200 according to a protocol of the host 60000. In an embodiment, the card interface 7100 may support a universal serial bus (USB) protocol, and an inter-chip (IC)-USB protocol. Here, the card interface may refer to hardware capable of supporting a protocol which is used by the host 60000, software installed in the hardware, or a signal transmission method.

When the memory system 70000 is connected to a host interface 6200 of the host 60000 such as a PC, a tablet PC, a digital camera, a digital audio player, a cellular phone, console video game hardware or a digital set-top box, the host interface 6200 may perform data communication with the memory device 1100 through the card interface 7100 and the memory controller 1200 under the control of a microprocessor 6100.

The present disclosure may delay setting of a QSR for a program command by a predetermined wait time in the operation of a memory system, and may set first the QSR for a read command before setting the QSR for the program command when a read command is inputted during the wait time, thus improving the read latency of the memory system.

Examples of embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A method for a memory controller controlling a non-volatile memory device, the method comprising:
  receiving a plurality of commands from a host;
  queueing a command among the plurality of commands into a queue status register based on a priority of the plurality of commands; and
  executing a next command among the plurality of commands to be performed after the command based on the priority of the plurality of commands and a category of the plurality of commands,
  wherein the queueing comprises:
  setting a status of the command as a set status; and
  setting the status of the command as a clear status after the memory device starts to perform an operation corresponding to the command.

2. The method of claim 1, wherein the executing the next command comprises setting a status of the next command as the set status.

3. The method of claim 2, wherein the plurality of commands include a write command and a read command.

4. The method of claim 3, wherein the executing the next command comprises setting a status of the read command to the set status prior to the write command for a predetermined time.

5. The method of claim 1, wherein the priority of the plurality of commands is an order provided from the host.

6. An apparatus, comprising:
  a memory device; and
  a controller coupled to the memory device and configured to:
  receive a plurality of commands from a host;
  queue a command among the plurality of commands into a queue status register based on a priority of the plurality of commands;
  set a status of the command as a set status;
  set the status of the command as a clear status after the memory device starts to perform an operation corresponding to the command; and
  execute a next command among the plurality of commands to be performed after the command based on the priority of the plurality of commands and a category of the plurality of commands.

* * * * *